(12) United States Patent
Chang et al.

(10) Patent No.: US 10,903,224 B2
(45) Date of Patent: Jan. 26, 2021

(54) SEMICONDUCTOR DEVICE AND METHOD FOR FABRICATING THE SAME

(71) Applicant: UNITED MICROELECTRONICS CORP., Hsinchu (TW)

(72) Inventors: Wen-Chung Chang, Hsinchu (TW); Tzu-Ping Chen, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/685,130

(22) Filed: Nov. 15, 2019

(65) Prior Publication Data

US 2020/0083244 A1 Mar. 12, 2020

Related U.S. Application Data

(62) Division of application No. 15/885,878, filed on Feb. 1, 2018, now Pat. No. 10,515,976.

(51) Int. Cl.
| | | |
|---|---|---|
| *H01L 27/11573* | (2017.01) | |
| *H01L 27/11568* | (2017.01) | |
| *H01L 27/11575* | (2017.01) | |
| *H01L 29/51* | (2006.01) | |
| *H01L 21/28* | (2006.01) | |

(52) U.S. Cl.
CPC .. *H01L 27/11573* (2013.01); *H01L 27/11568* (2013.01); *H01L 27/11575* (2013.01); *H01L 21/28158* (2013.01); *H01L 29/40117* (2019.08); *H01L 29/513* (2013.01); *H01L 29/518* (2013.01)

(58) Field of Classification Search
None
See application file for complete search history.

(56) References Cited

U.S. PATENT DOCUMENTS

| | | | |
|---|---|---|---|
| 4,541,001 A | 9/1985 | Schutten et al. | |
| 5,675,176 A | 10/1997 | Ushiku et al. | |
| 5,698,883 A | 12/1997 | Mizuno | |
| 5,910,018 A | 6/1999 | Jang | |
| 6,551,884 B2* | 4/2003 | Masuoka | H01L 21/82346 257/E21.625 |
| 10,515,976 B2* | 12/2019 | Chang | H01L 27/11568 |
| 2002/0119615 A1* | 8/2002 | Kim | H01L 27/105 438/201 |
| 2007/0099380 A1* | 5/2007 | Kim | H01L 27/11546 438/257 |
| 2010/0240193 A1* | 9/2010 | Kim | H01L 27/11526 438/424 |
| 2019/0237474 A1* | 8/2019 | Chang | H01L 27/11573 |
| 2020/0083244 A1* | 3/2020 | Chang | H01L 27/11575 |

* cited by examiner

*Primary Examiner* — Long Pham
(74) *Attorney, Agent, or Firm* — WPAT, PC

(57) ABSTRACT

A semiconductor device includes a semiconductor substrate, an isolation structure; a first gate dielectric layer and a first gate electrode. The isolation structure is formed in the semiconductor substrate to divide the semiconductor substrate at least into a first active region and a second active region. The first gate dielectric layer is disposed on the first active region, and has a plane top surface contacting to a sidewall of the isolation structure and forming an acute angle therewith. The first gate electrode stacked on the plane top surface.

5 Claims, 6 Drawing Sheets

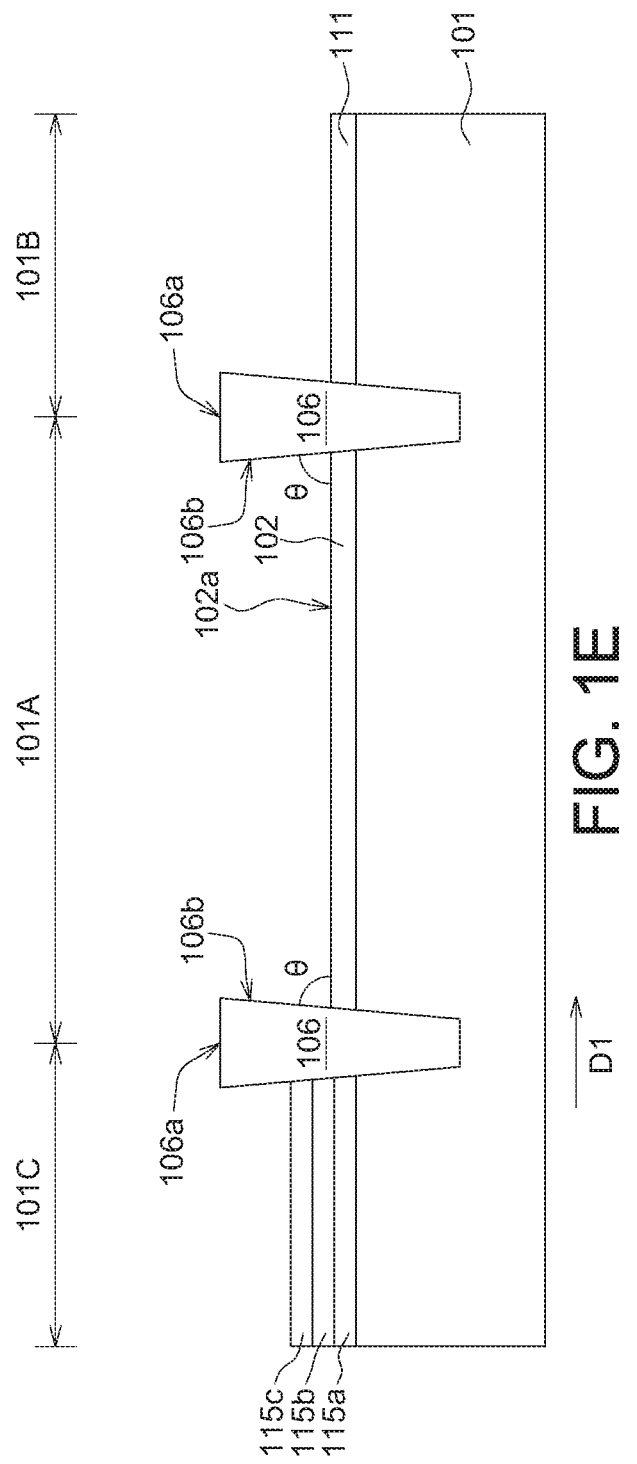

SEMICONDUCTOR DEVICE AND METHOD FOR FABRICATING THE SAME

This application is a divisional application of co-pending application Ser. No. 15/885,878, filed on Feb. 1, 2018, the subject matter of which is incorporated herein by reference.

BACKGROUND

Technical Field

The disclosure relates in generally to an integrated circuit (IC) and the method for fabricating the same, and more particularly to a semiconductor device having at least one gate dielectric layer and the method for fabricating the same.

Description of the Related Art

An IC having a plurality of semiconductor devices, such as an embedded non-volatile memory (NVM) IC having a plurality of NVM cells as well as at least one high-voltage metal oxide semiconductor (HVMOS) device, an input/output (I/O) device and a core device used for operating the NVM cells, is typically made by steps as follows: An isolation structure, such as a shallow trench isolation (STI), is firstly formed in a semiconductor substrate to define a memory region for forming the NVM cells and an active region for forming the HVMOS device, the I/O device and the core device. Subsequently, series downstream processes may be performed to form the HVMOS device, the I/O device and the core device on the logic area; and the NVM cells are then formed on the memory area.

However, prior to the forming of the dielectric layer involving in the HVMOS device, the I/O device or the core device, the surface stress and the topography of the semiconductor substrate may be distorted by various thermal treatments of which the process previously conducted on the semiconductor substrate. Dislocation of the dielectric layer subsequently formed on the distorted surface of the semiconductor substrate may occur. For example, the thermal treatments may result in a concave existing at the interface of the STI and the surface of the semiconductor substrate; and the dielectric layer formed on this location may be over thinning and the other layer formed thereon may not be aligned. As a result, the device involving the dielectric layer may fail due to the dislocation.

Therefore, there is a need of providing an improved semiconductor device and the method for fabricating the same to obviate the drawbacks encountered from the prior art.

SUMMARY

One aspect of the present disclosure is to provide a semiconductor device, wherein the semiconductor device includes a semiconductor substrate, an isolation structure; a first gate dielectric layer and a first gate electrode. The isolation structure is formed in the semiconductor substrate to at least divide the semiconductor substrate into a first active region and a second active region. The first gate dielectric layer is disposed on the first active region, and has a plane top surface contacting to a sidewall of the isolation structure and forming an acute angle therewith. The first gate electrode stacked on the plane top surface.

Another aspect of the present disclosure is to provide a method for fabricating a semiconductor device, wherein the method includes steps as follows: A semiconductor substrate is firstly provided. A first gate dielectric layer, a protection layer and a hard mask layer are then formed in sequence on the semiconductor substrate. Next, an isolation structure is formed in the semiconductor substrate and passing through the first gate dielectric layer, the protection layer and the hard mask layer, so as to at least divide the semiconductor substrate into a first active region and a second active region. Thereafter, the hard mask layer, the protection layer and a portion of the first gate dielectric layer disposed on the second active region are removed. Subsequently, a first gate electrode is formed on a remaining portion of the gate dielectric layer disposed on the first active region.

In accordance with the aforementioned embodiments of the present disclosure, a semiconductor device and the method for fabricating the same are provided. A gate dielectric layer of the semiconductor device protected by a protection layer is formed on a semiconductor substrate and prior to the forming of an isolation structure used to define an active area on which the semiconductor device is formed. Since the gate dielectric layer is formed prior to any other process conducted on the active area, the surface stress and the topography of the semiconductor substrate covered by the gate dielectric layer may not be distorted by the processes that are subsequently performed thereon, thus the problems of dislocation of the gate dielectric layer can be avoided, and the yield and performance of the device involving the dielectric layer can be improved.

BRIEF DESCRIPTION OF THE DRAWINGS

The above objects and advantages of the present disclosure will become more readily apparent to those ordinarily skilled in the art after reviewing the following detailed description and accompanying drawings, in which:

FIG. 1A to 1G are cross-sectional views illustrating a series of processing structure for fabricating a semiconductor device in accordance with one embodiment of the present disclosure.

DETAILED DESCRIPTION

Figure 1A:
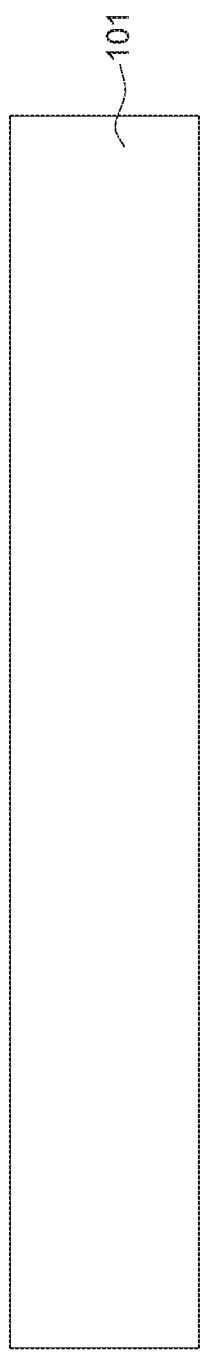

The embodiments as illustrated below provide a semiconductor device and the method for fabricating the same to solve the problems due to dislocation of the gate dielectric layer. The present disclosure will now be described more specifically with reference to the following embodiments illustrating the structure and arrangements thereof. It is to be noted that the following descriptions of preferred embodiments of this disclosure are presented herein for purpose of illustration and description only. It is not intended to be exhaustive or to be limited to the precise form disclosed.

Also, it is important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1A to 1G are cross-sectional views illustrating a series of processing structure for fabricating a semiconductor device 100 in accordance with one embodiment of the present disclosure. In the present embodiment, the semiconductor device 100 can be a memory device embedded with at least one NVM cells. The method for fabricating the semiconductor device 100 includes steps as follows:

Firstly, a semiconductor substrate 101 is provided (see FIG. 1A). In some embodiments of the present disclosure, the semiconductor substrate 101 can be a semiconductor substrate made of semiconductor materials (such as, silicon (Si), germanium (Ge), and so on), compound semiconductor materials (such as, gallium arsenide (GaAs)).

However, in some other embodiments, the semiconductor substrate 101 can include other layer. For example, in one embodiment, the semiconductor substrate 101 can be a silicon-on-insulator (SOI) substrate. In the present embodiment, the semiconductor substrate 101 is a silicon substrate.

Figure 1B:
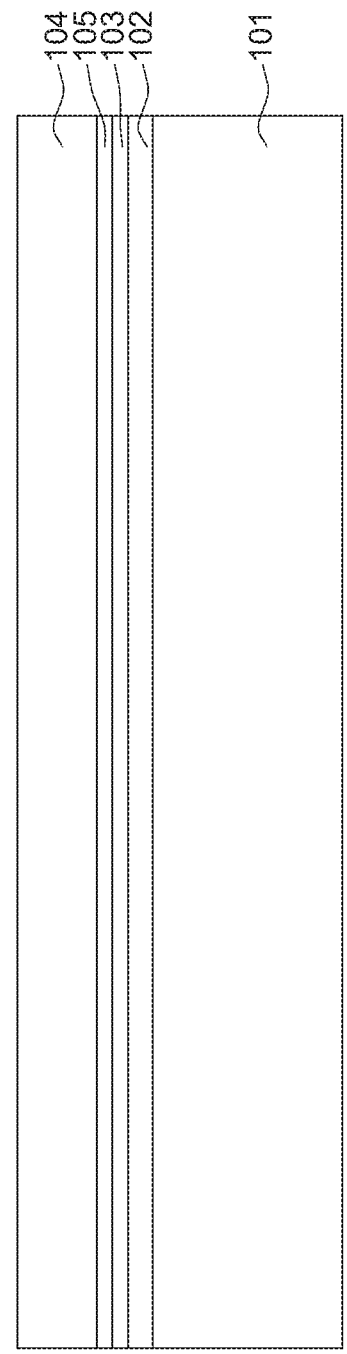
Figure 1C:
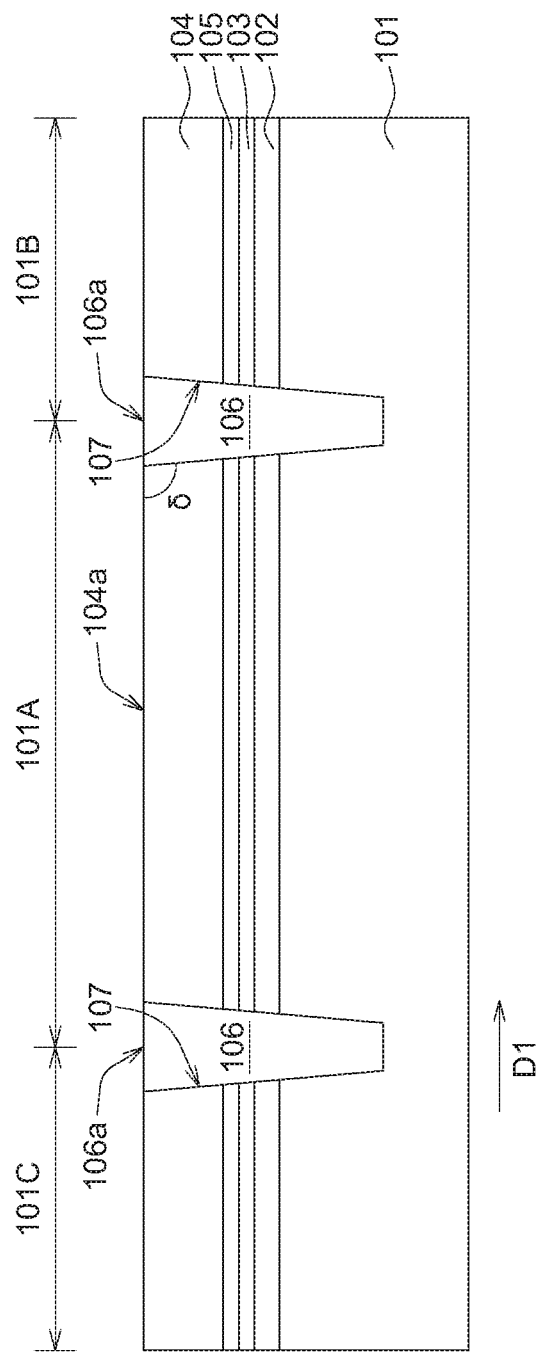

Next, a first gate dielectric layer 102, a protection layer 103 and a hard mask layer 104 are then formed in sequence on the semiconductor substrate 101 (see FIG. 1B). In some embodiments of the present disclosure, the first gate dielectric layer 102 can be made of silicon oxide (SiOx), silicon oxynitride (SiNO), silicon carbide (SiC), high dielectric constant (High-K) material (such as hafnium dioxide ($HfO_2$), zirconium dioxide ($ZrO_2$) and titanium dioxide ($TiO_2$)), any suitable dielectric material or the arbitrary combinations thereof; the protection layer 103 and the hard mask layer 104 can be made of silicon nitride (SiN). The first gate dielectric layer 102 may have a thickness substantially ranging from 10 nm to 40 nm. The protection layer 103 may have a thickness substantially ranging from 1 nm to 10 nm. The hard mask layer 104 may have a thickness greater than 50 nm.

In the present embodiment, prior to the forming of the hard mask layer 104, a buffer layer 105 can be formed on the protection layer 103; and the first gate dielectric layer 102 and the buffer layer 105 can be mad of silicon dioxide ($SiO_2$). The buffer layer 105 may have a thickness substantially ranging from 1 nm to 20 nm. The first gate dielectric layer 102 may have a thickness about 30 nm; the protection layer 103 may have a thickness about 10 nm; the buffer layer 105 may have a thickness about 15 nm; and the hard mask layer 104 may have a thickness about 100 nm.

Next, an isolation structure 106 arranged along a direction D1 is formed in the semiconductor substrate 101 and passing through the first gate dielectric layer 102, the protection layer 103, the buffer layer 105 and the hard mask layer 104, so as to at least divide the semiconductor substrate 101 into a first active region 101A (hereinafter referred to as a high-voltage region 101A), a second active region 101B (hereinafter referred to as a logic region 101B) and a memory region 101C (see FIG. 10). In some embodiments of the present disclosure, the isolation structure 106 can be a STI, and the forming of the isolation structure 106 includes steps as follows:

An etching process is firstly performed on the hard mask layer 104 to remove portions of the first gate dielectric layer 102, the protection layer 103, the buffer layer 105, the hard mask layer 104, and the semiconductor substrate 101, to form at least an opening 107 passing through the first gate dielectric layer 102, the protection layer 103, the buffer layer 105 and the hard mask layer 104 and exposing a portion of the semiconductor substrate 101. The opening 107 is then filled up with a dielectric material, and a planarization process, such as a chemical mechanical polishing (CMP), using the hard mask layer 104 as a stop layer is subsequently performed, whereby the isolation structure 106 may have a top surface 106a substantially level to the top surface 104a of the hard mask layer 104. In some embodiments, the opening 107 for forming the isolation structure 106 may flared from bottom to the top. In other words, the isolation structure 106 may taper off from the top surface 104a of the hard mask layer 104 towards the semiconductor substrate 101, so as to make at least one sidewall of the isolation structure 106 forming an angle δ with the top surface 104a of the hard mask layer 104 substantially greater than 90°.

Figure 1D:
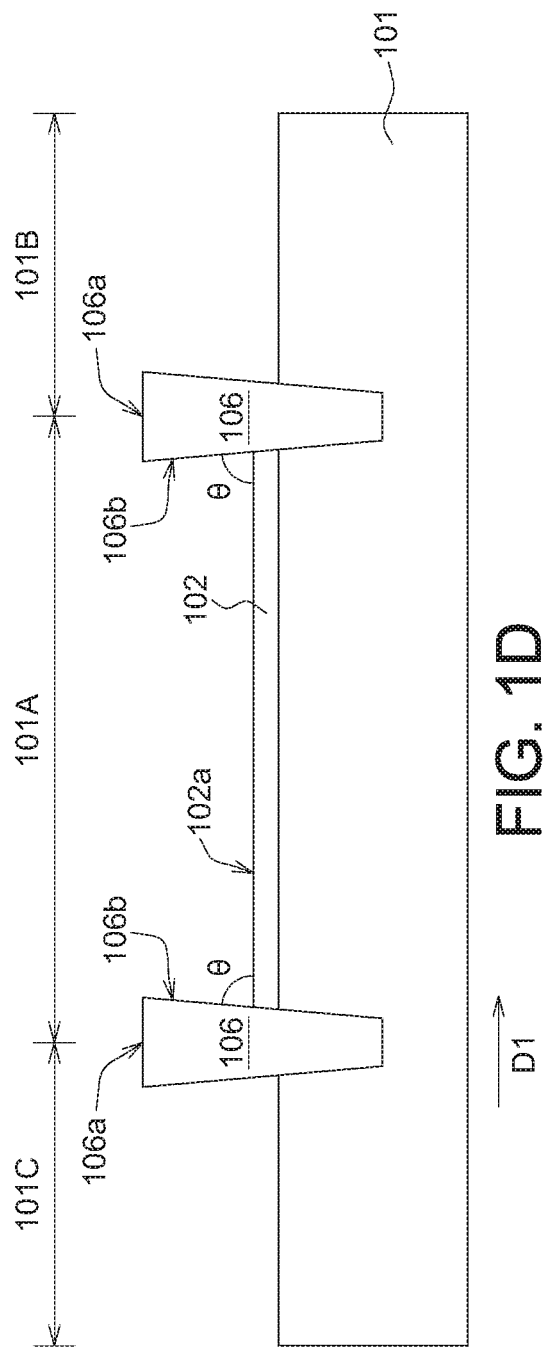

Thereafter, the hard mask layer 104, the buffer layer 105 the protection layer 103 and a portion of the first gate dielectric layer 102 disposed on the logic active region 101B and the memory region 101C are removed (see FIG. 1D). In some embodiments of the present disclosure, removing the hard mask layer 104, the buffer layer 105, the protection layer 103 and a portion of the first gate dielectric layer 102 includes steps as follows:

A patterned photoresist layer (not shown) is formed to cover the portion of the hard mask layer disposed on the high-voltage region 101A; and at least one etching process is performed to remove portions of the hard mask layer 104, the buffer layer 105, the protection layer 103 and the first gate dielectric layer 102 not covered by the patterned photoresist layer. After the patterned photoresist layer is peeled, a patterned photoresist layer (not shown) is formed to cover the logic region 101B and the memory region 101C, and at least one etching process using the remaining portion of the first gate dielectric layer 102 as a stop layer is performed to remove the remaining portions of the hard mask layer 104, the buffer layer 105 and the protection layer 103 disposed on the high-voltage region 101A, so as to expose the remaining portion of the first gate dielectric layer 102.

Because no any thermal treatment has been performed on the semiconductor substrate 101 prior to the forming of the first gate dielectric layer 102, the surface stress and the topography of the semiconductor substrate 101 may not be distorted, the first gate dielectric layer 102 can have an even structure; and the remaining portion of the first gate dielectric layer 102 serving as the etching stop layer can have a plane top surface 102a parallel to the top surface 104a of the removed hard mask layer 104 after the etching process.

In some embodiments of the present disclosure, the top surface 106a of the isolation structure 106 may be substantially higher than the plane top surface 102a of the first gate dielectric layer 102 as calculated from the semiconductor substrate 101. In addition, the plane top surface 102a of the first gate dielectric layer 102 may directly contact to a sidewall 106b of the isolation structure 106 and form an acute angle θ with the sidewall 106b of the isolation structure 106. Wherein the acute angle θ may range from 50° to 89°. In the present embodiment, the acute angle θ can be about 80°.

Subsequently, an ONO charge trapping structure and a second gate dielectric layer 111 are then respectively formed on the memory region 101C and the logic region 101B of the semiconductor substrate 101 (see FIG. 1E). In some embodiments of the present disclosure, the forming of the ONO charge trapping structure includes steps as follows:

A multi-layer composite structure at least including an upper silicon oxide layer 115c, a middle silicon nitride (SiN) layer 115b and a lower silicon oxide layer 115a is firstly formed on the semiconductor substrate 101 Next, an etching process is performed to remove portions of the upper silicon oxide layer 115c, the middle silicon nitride (SiN) layer 115b and the lower silicon oxide layer 115a to form an ONO charge trapping structure stacked on the memory region 101C of the semiconductor substrate 101.

In some embodiments of the present disclosure, the ONO charge trapping structure may include more other layers. For example, in some embodiments of the present disclosure, the ONO charge trapping structure can be a structure selected from a group consisting of an ONO structure, an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride, aluminum oxide, silicon nitride, silicon oxide, silicon (TANOS) structure and a metal-high-k bandgap-engineered silicon-oxide-nitride-oxide-silicon (MA BE-SONOS) structure.

The second gate dielectric layer 111 may be formed by a dielectric layer, such as a silicon dioxide layer, formed by a deposition and etching process on the on the logic region 101B of the semiconductor substrate 101. In some embodiments of the present disclosure, the process for forming the second gate dielectric layer 111 may be performed after the process for forming the ONO charge trapping structure. Alternatively, the process for forming the second gate dielectric layer 111 may be performed prior to the process for forming the ONO charge trapping structure.

Figure 1F:
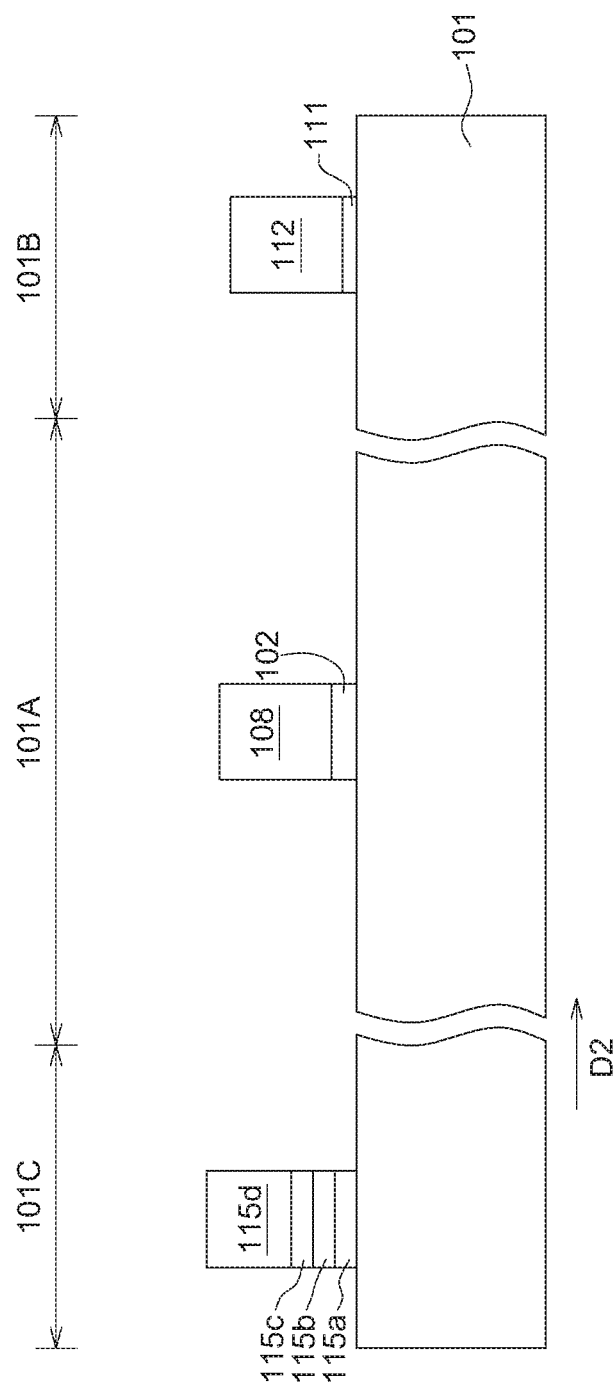

Next, a first gate electrode 108, a second gate electrode 112 and a control gate electrode 115d are respectively formed on the remaining portion of the first gate dielectric layer 102, the second gate dielectric layer 111 and the ONO charge trapping structure (see FIG. 1F). In some embodiments of the present disclosure, the forming of the first gate electrode 108, the second gate electrode 112 and the control gate electrode 115d includes steps as follows:

A poly-silicon layer (not shown) is firstly formed on the semiconductor substrate 101 to cover the high-voltage region 101A, the logic region 101B and the memory region 101C; and the poly-silicon layer is then patterned by a plurality of lithography/etching processes performed thereon to form the first gate electrode 108, the second gate electrode 112 and the control gate electrode 115d on the high-voltage region 101A, the logic region 101B and the memory region 101C respectively.

In the present embodiment, the lithography/etching process for forming the first gate electrode 108 may remove a portion of the poly-silicon layer and a portion of the first gate dielectric layer 102 on the high-voltage region 101A simultaneously to expose a portion of the substrate 101. The lithography/etching process for forming the second gate electrode 112 may remove a portion of the poly-silicon layer and a portion of the second gate dielectric layer 111 disposed on the logic region 101B simultaneously to expose a portion of the substrate 101. The lithography/etching process for forming the control gate electrode 115d may remove a portion of the poly-silicon layer and portions of the upper silicon oxide layer 115c, middle silicon nitride (SiN) layer and the lower silicon oxide layer 115a disposed on the memory region 101C simultaneously to expose a portion of the substrate 101. Since the exposed portions of the substrate 101 respectively disposed on the high-voltage region 101A, the logic region 101B and the memory region 101C are arranged along a direction D2 that is substantially perpendicular to the direction D1 (see FIGS. 1C-1E) along which the isolation structures 106 are arranged, thus the isolation structure 106 as depicted in FIGS. 1A-1E are not shown in FIG. 1F.

Figure 1G:
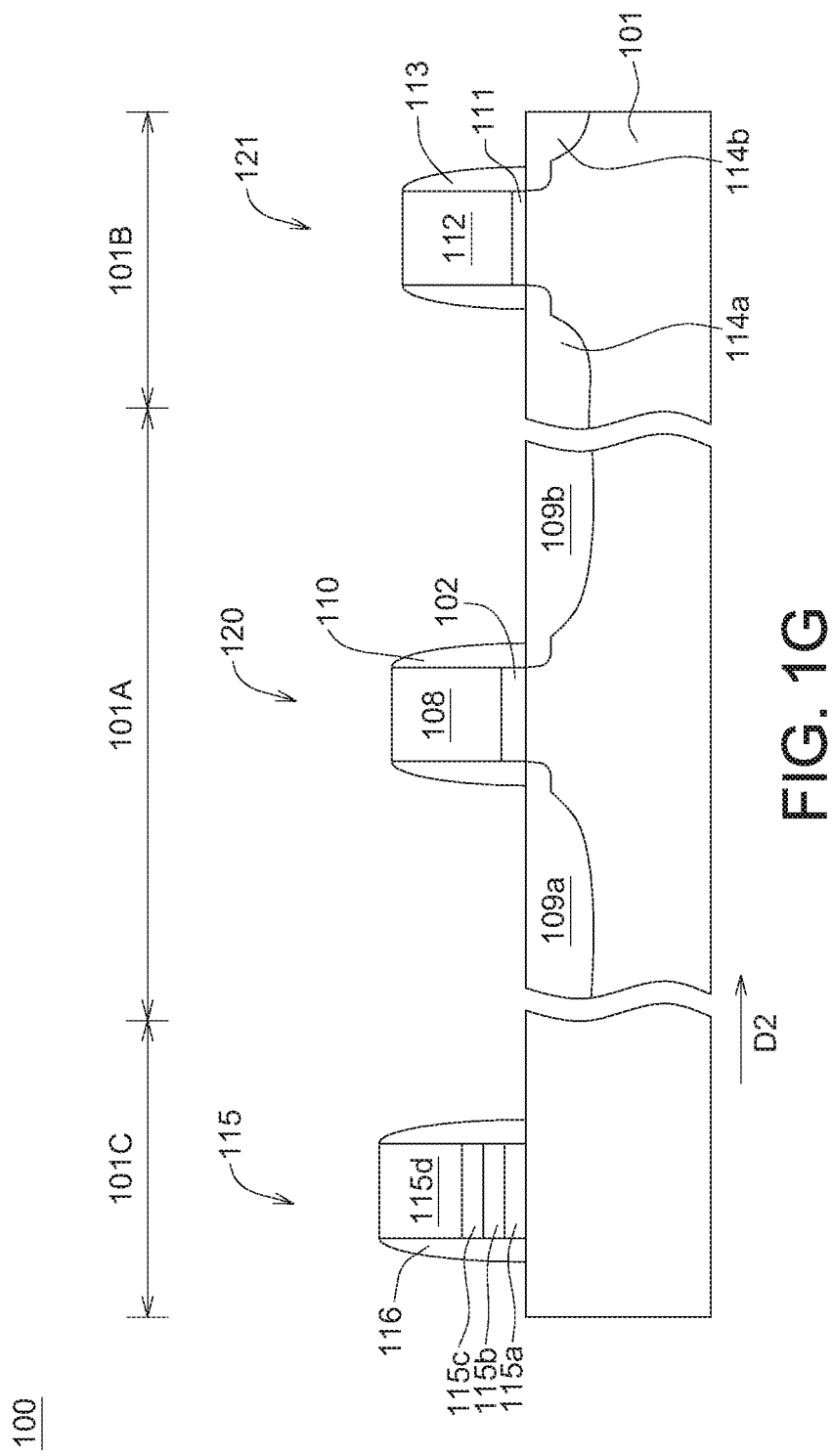

Thereinafter, a series of downstream process (no shown) are carried out, to respectively form a MOS transistor 120, a MOS transistor 121 and at least one NVM cells 115 on the high-voltage region 101A, the logic region 101B and the memory region 101C, meanwhile the process for forming the semiconductor device 100 as shown in FIG. 1G can be accomplished.

The forming of the MOS transistor 120 may include steps as follows: a spacer 110 is formed on the sidewalls of the first gate electrode 108 by a deposition and etching process; a source region 109a and a drain region 109b are formed in the semiconductor substrate 101 by at least one ion implantation process using the first gate electrode 108 and spacer 110 as a mask, and the assembly of the first gate dielectric layer 102, the first gate electrode 108, the source region 109a, the drain region 109b and the spacer 110 disposed on the high-voltage region 101A can form the MOS transistor 120. In the present embodiment, the MOS transistor 120 can be a HVMOS transistor serving as a special high-voltage element for operating the NVM cells 115 formed in the subsequent processes. However, the element formed on the high-voltage region 101A may not be limited to this regard. In some other embodiments, the element formed on the high-voltage region 101A can be other electrical elements such as an I/O device.

The forming of the MOS transistor 121 may include steps as follows: A spacer 113 is formed on the sidewalls of the second gate electrode 112; a source region 114a and a drain region 114b are formed in the semiconductor substrate 101 by at least one ion implantation process using the second gate electrode 112 and spacer 113 as a mask, and the assembly of the second gate dielectric layer 111, the second gate electrode 112, the source region 114a, the drain region 114b and the pacer 113 disposed on the logic region 101B can form the MOS transistor 121. In the present embodiment, the MOS transistor 121 can serve as a logic element of the memory device.

The forming of the NVM cells 115 may include steps as follows:

After the control gate electrode 115d is formed on the upper silicon oxide layer 115c, a spacer 116 is formed on sidewalls of the ONO charge trapping structure and the control gate electrode 115d, whereby a NVM cell 115 can be formed on the memory region 101C of the semiconductor substrate 101.

Of note that, for clearer describing purpose, merely one NVM cells 115 is depicted in FIG. 1F; and in some other embodiments, the process for forming the NVM cell 115, may be performed prior to that for forming the logic element 121 performed on the logic region of the semiconductor substrate 101.

In accordance with the aforementioned embodiments of the present disclosure, a semiconductor device and the method for fabricating the same are provided. A gate dielectric layer of the semiconductor device protected by a protection layer is formed on a semiconductor substrate and prior to the forming of an isolation structure used to define an active area on which the semiconductor device is formed. Since the gate dielectric layer is formed prior to any other process conducted on the active area, the surface stress and the topography of the semiconductor substrate covered by the gate dielectric layer may not be distorted by the processes that are subsequently performed thereon, thus the problems of dislocation of the gate dielectric layer can be avoided, and the yield and performance of the device involving the dielectric layer can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a semiconductor device comprising:
   providing a semiconductor substrate;
   forming a first gate dielectric layer, a protection layer and a hard mask layer in sequence on the semiconductor substrate;
   forming an isolation structure in the semiconductor substrate and passing through the first gate dielectric layer, the protection layer and the hard mask layer, so as to at least divide the semiconductor substrate into a first active region and a second active region;
   removing the hard mask layer, the protection layer and a portion of the first gate dielectric layer disposed on the second active region; and
   forming a first gate electrode on a remaining portion of the first gate dielectric layer disposed on the first active region.

2. The method according to claim 1, further comprising forming a buffer layer on the protection layer prior to the forming of the hard mask layer.

3. The method according to claim 2, wherein the protection layer and the hard mask layer comprise silicon nitride (SiN), and the buffer layer comprises silicon oxide (SiOx).

4. The method according to claim 3, wherein the protection layer has a thickness substantially ranging from 1 nm to 10 nm; the buffer layer has a thickness substantially ranging from 1 nm to 20 nm; and the hard mask layer has a thickness greater than 50 nm.

5. The method according to claim 1, after the hard mask layer, the protection layer and the portion of the first gate dielectric layer disposed on the second active region are removed, further comprising:
   forming a second dielectric layer disposed on the second active region; and
   forming a second gate electrode stacked on the second dielectric layer.

* * * * *